(12) United States Patent
Huang et al.

(10) Patent No.: US 6,441,494 B2
(45) Date of Patent: Aug. 27, 2002

(54) MICROELECTRONIC CONTACTS

(75) Inventors: Yin Huang; Er-Xuan Ping, both of Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/834,192

(22) Filed: Apr. 12, 2001

Related U.S. Application Data

(62) Division of application No. 09/546,068, filed on Apr. 10, 2000, now Pat. No. 6,313,026.

(51) Int. Cl.$^7$ .................. H01L 23/52; H01L 23/528
(52) U.S. Cl. ............................ 257/774; 257/758
(58) Field of Search .................. 257/752, 758, 257/774

(56) References Cited

U.S. PATENT DOCUMENTS

| | | | |
|---|---|---|---|
| 4,837,176 A | | 6/1989 | Zdebel et al. .............. 437/31 |
| 4,916,002 A | * | 4/1990 | Carver ..................... 216/11 |
| 5,114,879 A | | 5/1992 | Madan ..................... 437/195 |
| 5,468,681 A | | 11/1995 | Pasch ..................... 437/183 |
| 5,488,238 A | * | 1/1996 | Enraku et al. ............. 257/204 |
| 5,619,071 A | * | 4/1997 | Myers et al. .............. 257/753 |
| 5,632,631 A | | 5/1997 | Fjelstad et al. ............ 439/82 |
| 5,986,339 A | * | 11/1999 | Pai et al. ................. 257/686 |
| 6,087,189 A | * | 7/2000 | Huang ..................... 438/10 |
| 6,222,270 B1 | | 4/2001 | Lee ....................... 257/758 |
| 6,265,778 B1 | * | 7/2001 | Tottori ................... 257/529 |

OTHER PUBLICATIONS

"Improved Structure For An Electrical Contact To A Thin Film In A Semiconductor Structure And Method For Making The Same"; Ser. No. 09/385,586; Filed Aug. 27, 1999.

* cited by examiner

*Primary Examiner*—Allan R. Wilson
(74) *Attorney, Agent, or Firm*—Howrey Simon Arnold & White, LLP

(57) ABSTRACT

A method for producing reliable contacts in microelectronic devices and contacts produced thereby are provided. In one embodiment of the invention, a first conductive layer is formed over a first dielectric layer. The first conductive layer contains a pattern etched therein. A second dielectric layer is deposited over the first conductive layer and a via is etched therein over the pattern, thus exposing a portion of the pattern and the first conductive layer. The structure is then further etched to remove a portion of the first dielectric layer using the exposed portions of the first conductive layer as a mask. The structure is then subject to an isotropic etch to create undercuts in the first dielectric layer underneath the exposed portions of the first conductive layer. A conductive material can then be deposited into the via to fill the undercut, thus contacting the first conductive material on the exposed top, sides, and underside of the layer to produce a highly reliable contact. This technique is also adapted to create vias that are used to connect three or more conductive layers.

17 Claims, 15 Drawing Sheets

MICROELECTRONIC CONTACTS

This application is a divisional of application Ser. No. 09/546,068, filed Apr. 10, 2000, now U.S. Pat. No. 6,313, 026 which is incorporated by reference.

FIELD OF THE INVENTION

This invention relates generally to the manufacture of semiconductor devices and more specifically to a method for forming a more reliable interlayer contact.

BACKGROUND OF THE INVENTION

It is common in semiconductor devices to make a vertical contact between two horizontal conductive layers by etching a hole (sometime called a "via") in the dielectric that separates the two layers. Such a contact can be established in a number of ways. The traditional way of forming a contact has been to etch a via in the dielectric that covers a first conductive layer, and then depositing a second conductive layer on the dielectric layer such that the material that comprises the second conductive layer enters the via and makes mechanical/electrical contact with the first conductive layer. Alternatively, the trend in more modem devices has been to etch the via, and then to fill the via with a conductive substance to form a "plug." A plug is formed by depositing the conductive substance in the via so as to come in mechanical/electrical contact with the first conductive layer, and then polishing the remainder of the conductive substance which resides on top of the dielectric surface away, for example, by chemical-mechanical-polishing (CMP). Once the plug is formed, the second conductive layer can be deposited on top of the plug so as to come in mechanical/electrical contact with the plug, and thus in mechanical/electrical contact with the first conductive layer.

The various ways of making contacts have certain drawbacks. For example, in DRAM (dynamic random access memory) technologies it is desirable to make periodic contacts to the cell plate of the capacitor in each cell for the purpose of applying a reference voltage thereto. (An example of a DRAM cell with a cell plate can be found in the assignee's copending application Ser. No. 09/385,586, which is herein incorporated by reference in its entirety). To economize the process, this processing step can also be used to form contacts to other structures, for example, to the control gates in the peripheral portion of the memory device. However, the mechanical/electrical quality of the contacts formed can vary due to the fact that the dielectric overlying the control gate and the cell plate are of different thicknesses, and due to the fact the control gate and the cell plate are made from different materials which will be more or less susceptible to the via etch. These problems are worsened if the conductive materials to be brought into contact do not adhere well to one another (e.g., tungsten and polysilicon). Moreover, the CMP polishing can cause the material in the via that forms the plug to become loose, thereby rendering the contact mechanically/electrically unstable. The cell plate vias are particularly susceptible to this sort of instability because they are thin in comparison to the control. gate vias. (Other problems associated with making a reliable cell plate contact, and a method for fixing such problems, can be found in the assignee's copending application Ser. No. 09/385,586

Special problems with contact stability are exacerbated when it is desired to electrically connect not two but three or more horizontal conductive layers. The traditional approach has been to create vias to connect each conductive layer to only the conductive layer directly above it. However, this technique is labor intensive and is susceptible to problems when the vias are stacked on top of one another due to the potentially uneven surface of the conductor underlying a given via. Misalignment of the vias with respect to one another can exacerbate the unreliability of the contact.

The present inventions provide a contact structure that fixes these problems, and a method of producing such structures, thereby providing a relatively simple and reliable way for creating quality contacts between conductive layers.

SUMMARY OF THE INVENTION

In view of the foregoing considerations, the present invention is directed in one respect to a method for constructing a contact between a first conductive layer and a second conductive layer in a microelectronic device, which comprises forming a first material on a substrate; forming a first conductive layer with a top surface on the first material; forming a pattern in the first conductive layer, the pattern defining edges in the first conductive layer; forming a dielectric layer on the surface of the first conductive layer; removing a portion of the dielectric layer over the pattern to expose at least a portion of the pattern, a portion of the top surface of the first conductive layer, and a portion of the edges in the first conductive layer; removing a portion of the first material beneath the exposed portion of the pattern; forming an undercut in the first material which is underneath the exposed surface of the first conductive layer; forming a conductive material on the structure wherein the conductive material fills a portion of the undercut, contacts the exposed edges in the first conductive layer, and contacts the exposed top surface of the first conductive layer; and forming a second conductive layer in contact with the conductive material, whereby the first conductive layer and the second conductive layer are brought into contact through the conductive material.

Another aspect of the invention is directed to a contact structure for connecting a first conductive layer and a second conductive layer in a microelectronic device, which comprises a first dielectric layer formed on a substrate; a first conductive layer formed on the first dielectric layer, the first conductive layer having a top surface, the first conductive layer also having a pattern etched therein, the pattern defining an edge in the first conductive layer; a second dielectric layer deposited on the top surface of the first conductive layer; a via formed in the second dielectric layer, the via passing through at least a portion of the pattern and into the first dielectric layer, wherein the via exposes a portion of the top surface of the first conductive layer and a portion of the edge in the first conductive layer; an undercut region in the first dielectric layer below the first conductive layer proximate to at least a portion of the edge in the first conductive layer, the undercut region being in communication with the via; a conductive material, wherein the conductive material substantially fills the undercut region and the via, and wherein the conductive material is in contact with at least a portion of the exposed top surface of the first conductive layer and at least a portion of the exposed edge in the first conductive layer; and a second conductive layer in contact with the conductive material, whereby the first and second conductive layers are brought into contact through the conductive material.

Another aspect of the invention is directed to a method for establishing contact between a first conductive layer, a second conductive layer, and a third conductive layer in a microelectronic device, which comprises forming a first conductive layer with a top surface on a substrate; forming a first dielectric layer on the top surface of the first conductive layer; forming a second conductive layer with a top surface on the first dielectric layer; forming a pattern in the second conductive layer, the pattern defining an edge in the second conductive layer; forming a second dielectric layer on the top surface of the second conductive layer; removing a portion of the second dielectric layer over the pattern to expose at least a portion of the pattern, a portion of the top surface of the second conductive layer, and a portion of the edge in the second conductive layer; removing a portion of the first dielectric layer beneath the exposed portion of the pattern to expose a portion of the top surface of the first conductive layer; forming a conductive material on the structure wherein the conductive material contacts the exposed top surface of the first conductive layer, contacts the exposed edges in the second conductive layer, and contacts the exposed top surface of the second conductive layer; and forming a third conductive layer in contact with the conductive material, whereby the first conductive layer, the second conductive layer, and the third conductive layer are brought into contact through the conductive material.

Another aspect of the invention is directed to a contact structure for connecting a first conductive layer, a second conductive layer, and a third conductive layer in a microelectronic device, which comprises a first conductive layer formed on a substrate, the first conductive layer having a top surface; a first dielectric layer deposited on the top surface of the first conductive layer; a second conductive layer formed on the first dielectric layer, the second conductive layer having a top surface, the second conductive layer also having a pattern etched therein, the pattern defining an edge in the second conductive layer; a second dielectric layer formed on the second conductive layer; a via formed in the second and first dielectric layers, the via passing through at least a portion of the pattern and into the first dielectric layer, wherein the via exposes at least a portion of the top surface of the second conductive layer, a portion of the edge in the second conductive layer, and a portion of the top surface of the first conductive layer; a conductive material, wherein the conductive material substantially fills the via, and wherein the conductive material is in contact with at least a portion of the exposed top surface of the second conductive layer, a portion of the exposed edge in the second conductive layer, and a portion of the exposed top surface of the first conductive layer; and a third conductive layer in contact with the conductive material, whereby the first, second, and third conductive layers are brought into contact through the conductive material.

Another aspect of the invention is directed to a method for establishing a contact between a first conductive layer, a second conductive layer, a third conductive layer, and a fourth conductive layer in a microelectronic device, which comprises forming a first conductive layer with a top surface on a substrate; forming a first dielectric layer on the top surface of the first conductive layer; forming a second conductive layer with a top surface on the first dielectric layer; forming a first pattern in the second conductive layer, the first pattern defining an edge in the second conductive layer; forming a second dielectric layer on the top surface of the second conductive layer; forming a third conductive layer with a top surface on the second dielectric layer; forming a second pattern in the third conductive layer, said second pattern defining an edge in the third conductive layer, wherein the second pattern is located at least in part above the first pattern; forming a third dielectric layer on the top surface of the third conductive layer; removing a portion of the third dielectric layer over the second pattern to expose at least a portion of the second pattern, a portion of the top surface of the third conductive layer, and a portion of the edge in the third conductive layer; removing a portion of the second dielectric layer over the first pattern to expose at least a portion of the first pattern, a portion of the top surface of the second conductive layer, and a portion of the edge in the second conductive layer; removing a portion of the first dielectric layer beneath the exposed portion of the first pattern to expose a portion of the surface of the first conductive layer; forming a conductive material on the structure wherein the conductive material contacts the exposed surfaces of the second and third conductive layers, contacts the exposed edges in the second and third conductive layers, and contacts the exposed surface of the first conductive layer; and forming a fourth conductive layer in contact with the conductive material, whereby the first conductive layer, the second conductive layer, the third conductive layer, and the fourth conductive layer are brought into contact through the conductive material.

Another aspect of the invention is directed to a contact structure for connecting a first conductive layer, a second conductive layer, a third conductive layer, and a fourth conductive layer in a microelectronic device, which comprises a first conductive layer formed on a substrate, the first conductive layer having a top surface; a first dielectric layer deposited on the top surface of the first conductive layer; a second conductive layer formed on the first dielectric layer, the second conductive layer having a top surface, the second conductive layer also having a first pattern etched therein, the first pattern defining an edge in the second conductive layer; a second dielectric layer formed on the top surface of the second conductive layer; a third conductive layer formed on the second dielectric layer, the third conductive layer having a top surface, the third conductive layer also having a second pattern etched therein, the second pattern defining an edge in the third conductive layer; a third dielectric layer formed on the top surface of the third conductive layer; a via formed in the third, second, and first dielectric layers, the via passing through at least a portion of the second and first patterns, wherein the via exposes at least a portion of the top surfaces of the third and second conductive layers, a portion of the edges in the third and second conductive layers, and a portion of the top surface of the first conductive layer; a conductive material, wherein the conductive material substantially fills the via, and wherein the conductive material is in contact with at least a portion of the exposed top surfaces of the third and second conductive layers, a portion of the exposed edges in the third and second conductive layers, and a portion of the exposed top surface of the first conductive layer; and a fourth conductive layer in contact with the conductive material, whereby the first, second, third, and fourth conductive layers are brought into contact through the conductive material.

BRIEF DESCRIPTION OF THE DRAWINGS

The foregoing and other features and aspects of the present invention will be best understood with reference to the following detailed description of specific embodiments of the invention, when read in conjunction with the accompanying drawings, wherein.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and design decisions must be made to achieve the developers' specific goals and subgoals (e.g., compliance with system- and business-related constraints), which will vary from one implementation to another. Moreover, attention will necessarily be paid to proper engineering and design practices for the environment in question. It will be appreciated that such a development effort might be complex and time-consuming, but would nevertheless be a routine undertaking for those of ordinary skill in the field of semiconductor processing.

A first embodiment of the invention is found in FIGS. 1–11, which discloses a method for making a contact of improved reliability. This technique could be used, for example, to make a highly reliable contact to a DRAM cell plate, or to any other structure which requires a high reliability contact between multiple thin layers, such as an antifuse. The process starts by depositing a first conductive layer 14 to be contacted on a substrate 10, which is typically a doped or undoped crystalline silicon. This first conductive layer 14 could be, for example, the doped polysilicon that comprises the cell plate of a DRAM cell capacitor, but it could also be any suitably conductive material used in semiconductor processing such as aluminum, tungsten, titanium, or crystalline silicon. As disclosed, the first conductive layer 14 is disposed on top of a first dielectric layer 12, although this is not strictly necessary. The first conductive layer 14 has patterned in it a cross 16 of width W and diagonal X. One skilled in the art will recognize that because the first conductive layer 14 might be used elsewhere in the process to create structures other than the cell plate (e.g., the control gates), the cross 16 may be patterned at the same time that these other structures are patterned.

Figure 1:
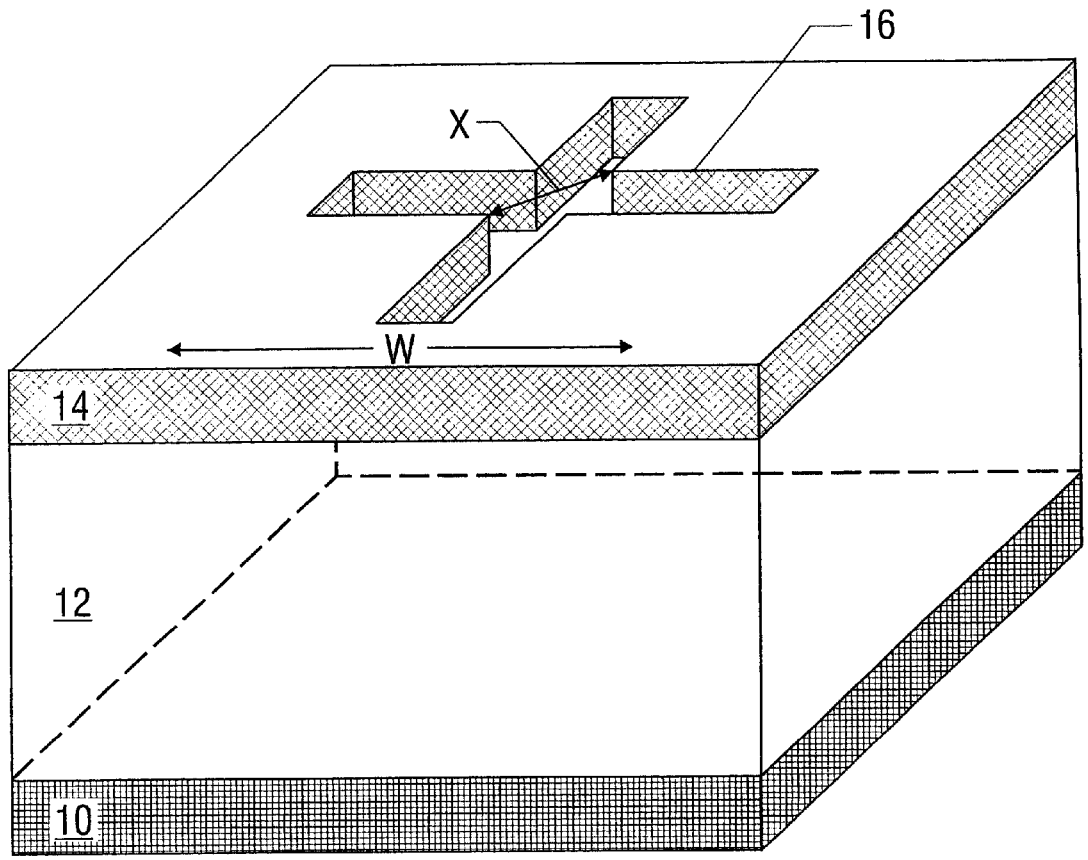
FIG. 1 shows a three-dimensional view of a portion of a microelectronic device with a first conductive layer deposited thereon containing a cross.
Figure 2:
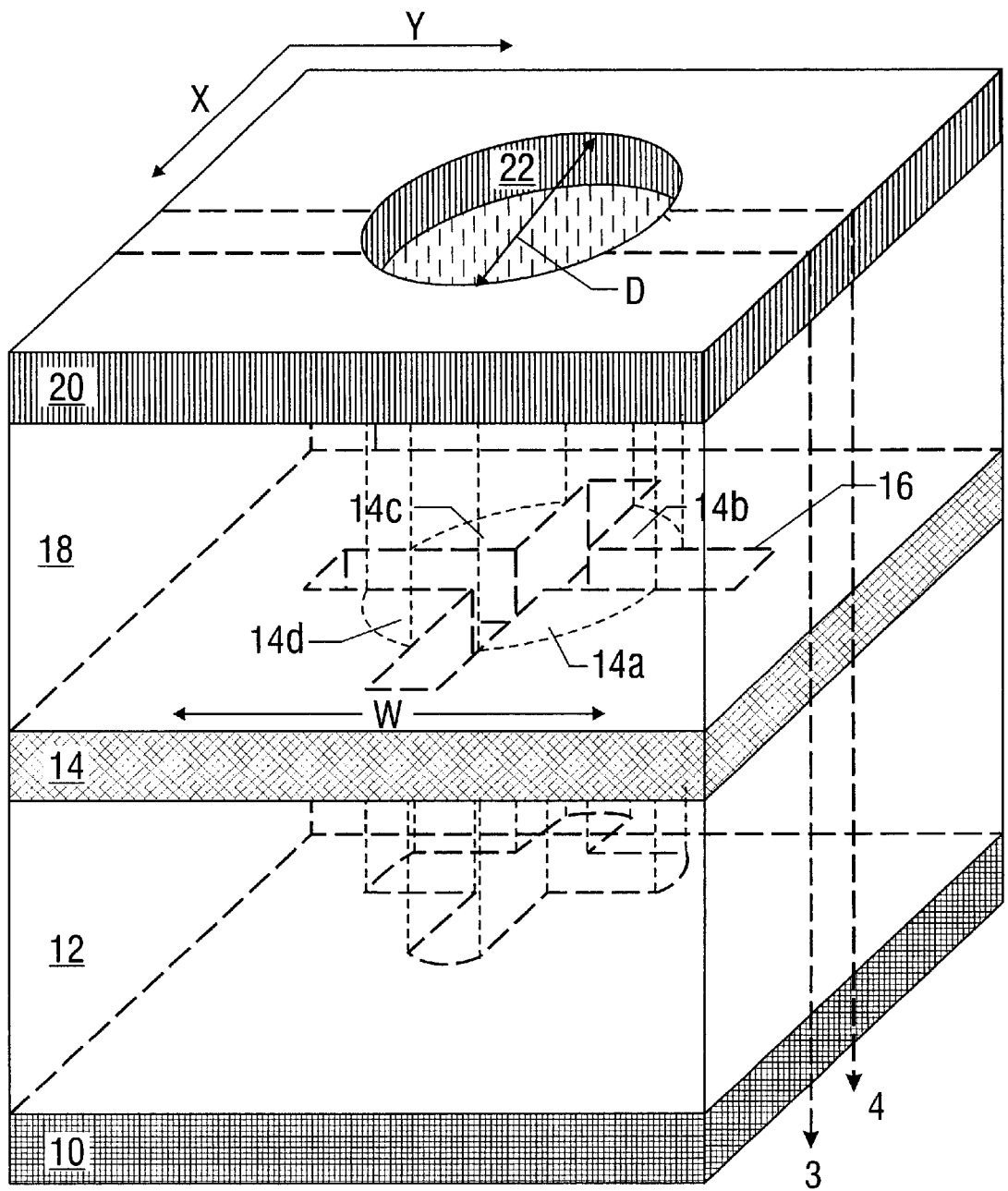
FIG. 2 shows a three-dimensional view of the process after deposition of a second dielectric layer and etching of a via within the device.
Figure 3:
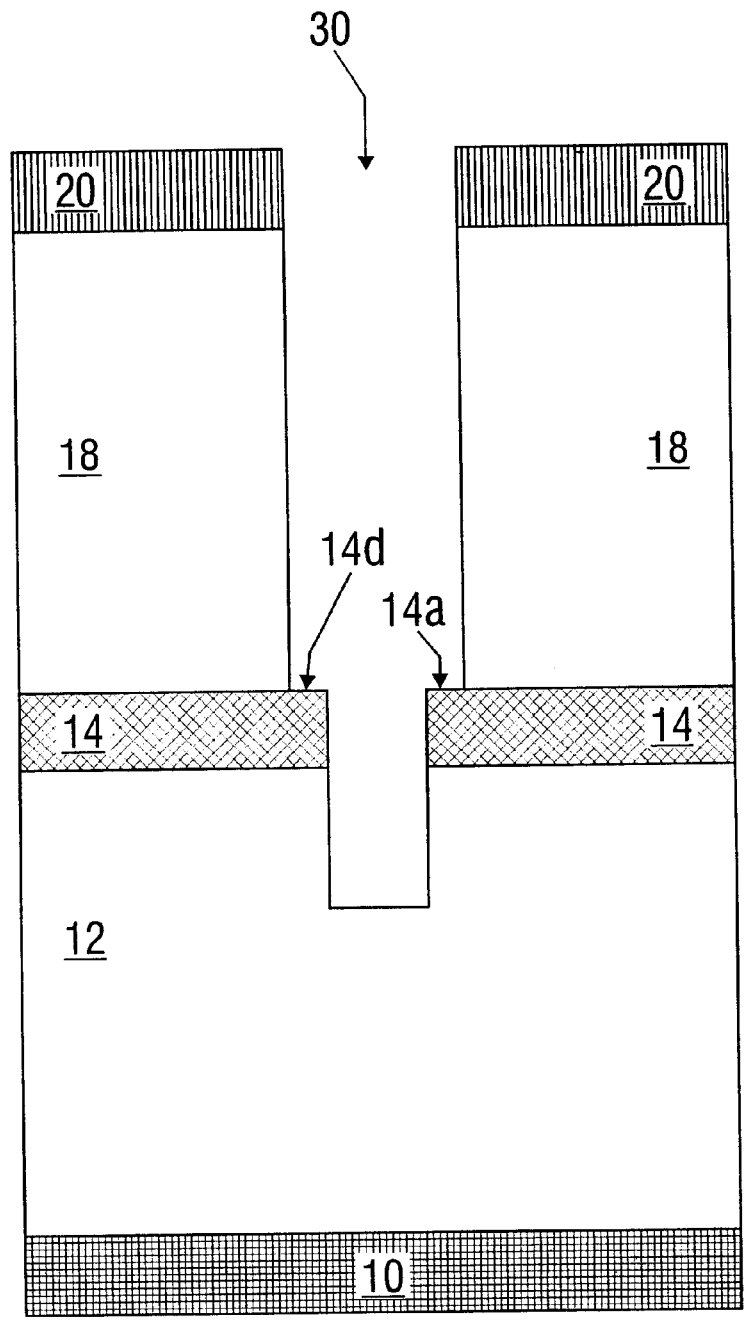
FIG. 3 shows a cross-sectional view of the device in FIG. 2 which is taken off center of the device.
Figure 4:
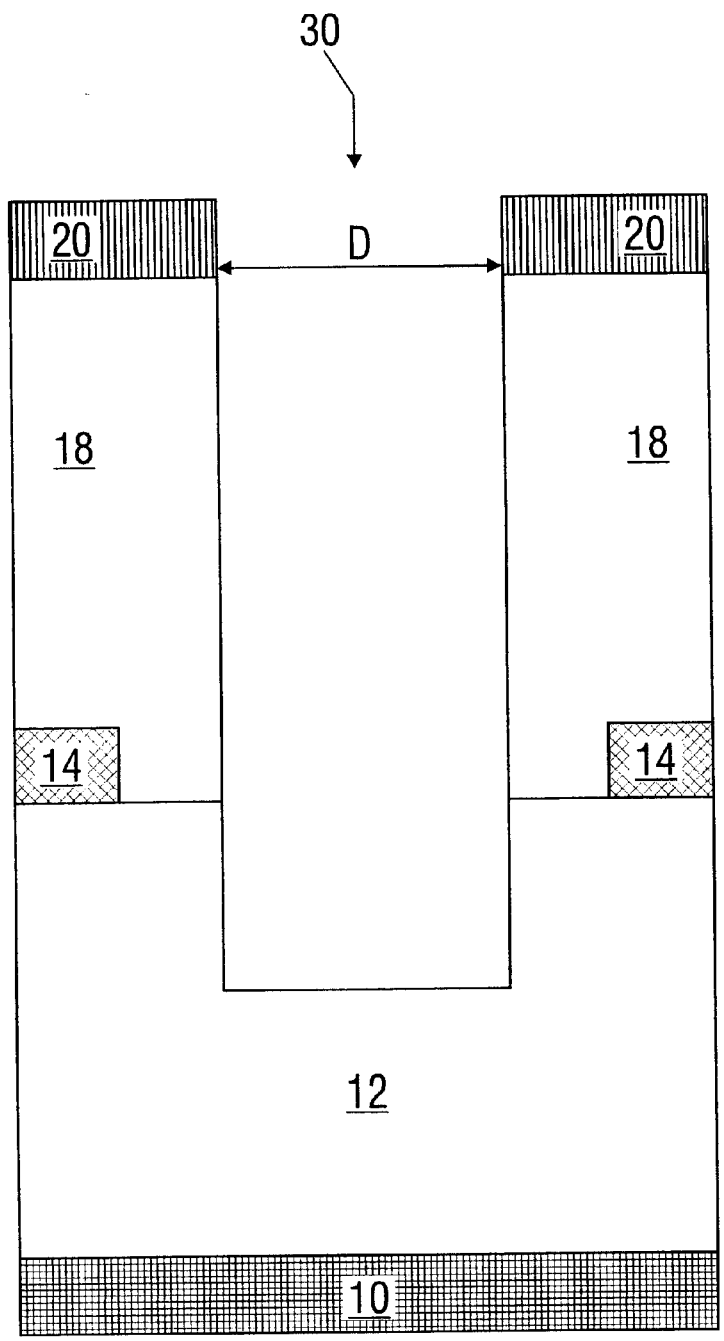
FIG. 4 shows a cross-sectional view of the device in FIG. 2 which is taken through the center of the device.

Next, and referring to FIGS. 2, 3, and 4, a second dielectric layer 18 is deposited on the top surface of the first conductive layer 14. The dielectric layer 18 is preferably a silicon dioxide, referred to as an "oxide" by those of skill in the art. However, other suitable dielectrics such as nitrides can also be used. After deposition of the second dielectric layer 18 it may be preferable to planarize the surface, for example, using CMP. This is followed by the application of a photoresist 20 on the surface of the second dielectric layer 18. The photoresist 20 is masked using standard photolithography techniques, exposed, and developed to form an opening 22 of diameter D therein. D is preferably chosen to be greater than diagonal X but less than width W for reasons that will become clear shortly. The opening 22 is preferably patterned immediately above the cross 16.

The structure is next subject to an anisotropic dielectric etch to form a via 30, and one of ordinary skill will recognize that several suitable dielectric etches exist in the art of semiconductor processing. This etch removes the second dielectric layer 18 in a fashion substantially perpendicular to the substrate 10 to form a cylindrical via therein. When the dielectric etch reaches the cross 16, it will expose and be blocked by areas 14a, 14b, 14c and 14d of the first conductive layer 14. As one of skill will recognize, areas 14a, 14b, 14c and 14d will be unaffected by the dielectric etch because of its high selectivity thereto, and thus acts as a mask with respect to further etching of the structure; this is best seen in the cross-section of FIG. 3. However, where the dielectric etch meets the cross 16, as best seen in the cross-section of FIG. 4 which cuts directly through the center of cross 16 and opening 22, etching continues preferably through the cross 16 and down into the first dielectric layer 12. Because the etch is blocked by areas 14a, 14b, 14c and 14d, the geometry of the via formed in the first dielectric layer 12, when viewed from the top of the device, constitutes the intersection of the opening 22 and cross 16, and thus resembles a smaller cross with curved edges, as best seen in FIG. 2. While the amount of etching into the first dielectric layer 12 will usually be very small, the amount of overetch into this layer is greatly exaggerated in FIGS. 2, 3 and 4 to more clearly highlight the advantages of this embodiment of the invention. This etching step thus defines a via 30 within the etched structure.

Figure 5:
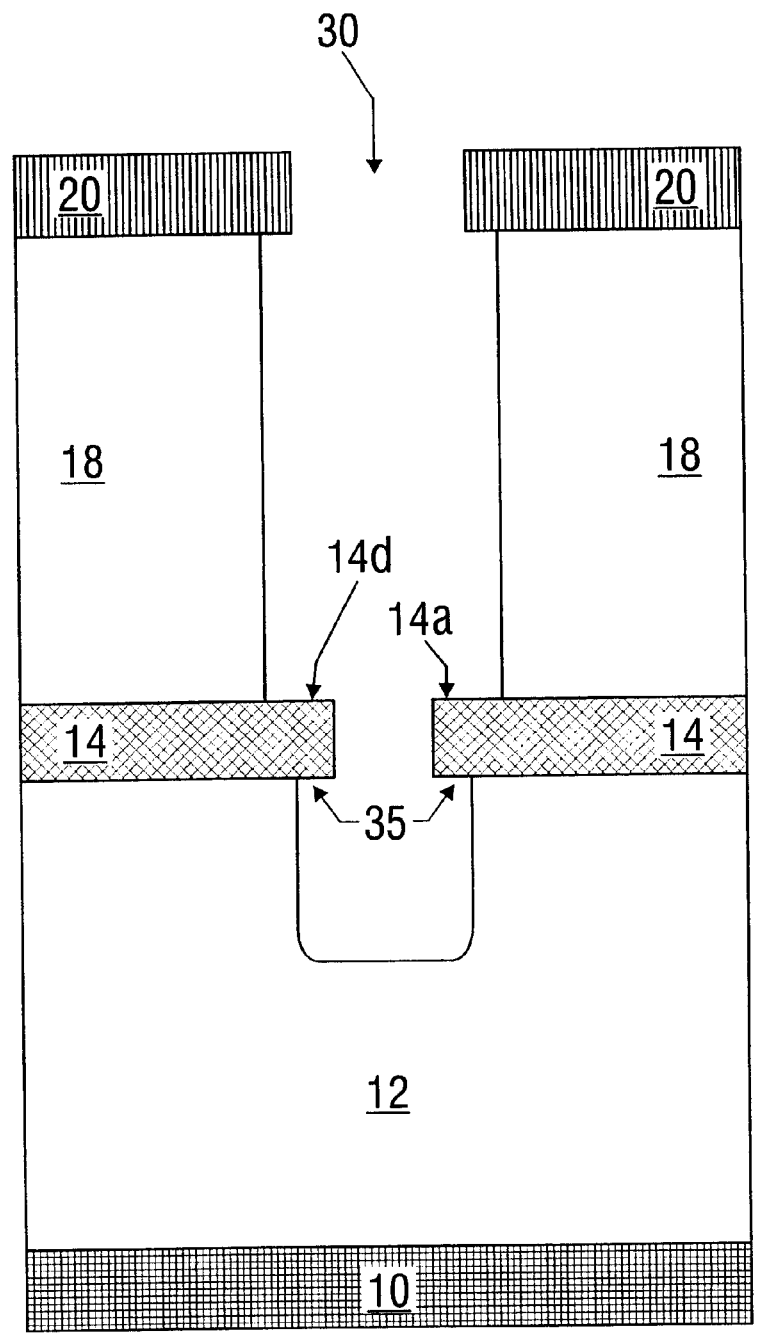
FIG. 5 shows the cross-sectional view of FIG. 3 after an isotropic dielectric etch.
Figure 6:
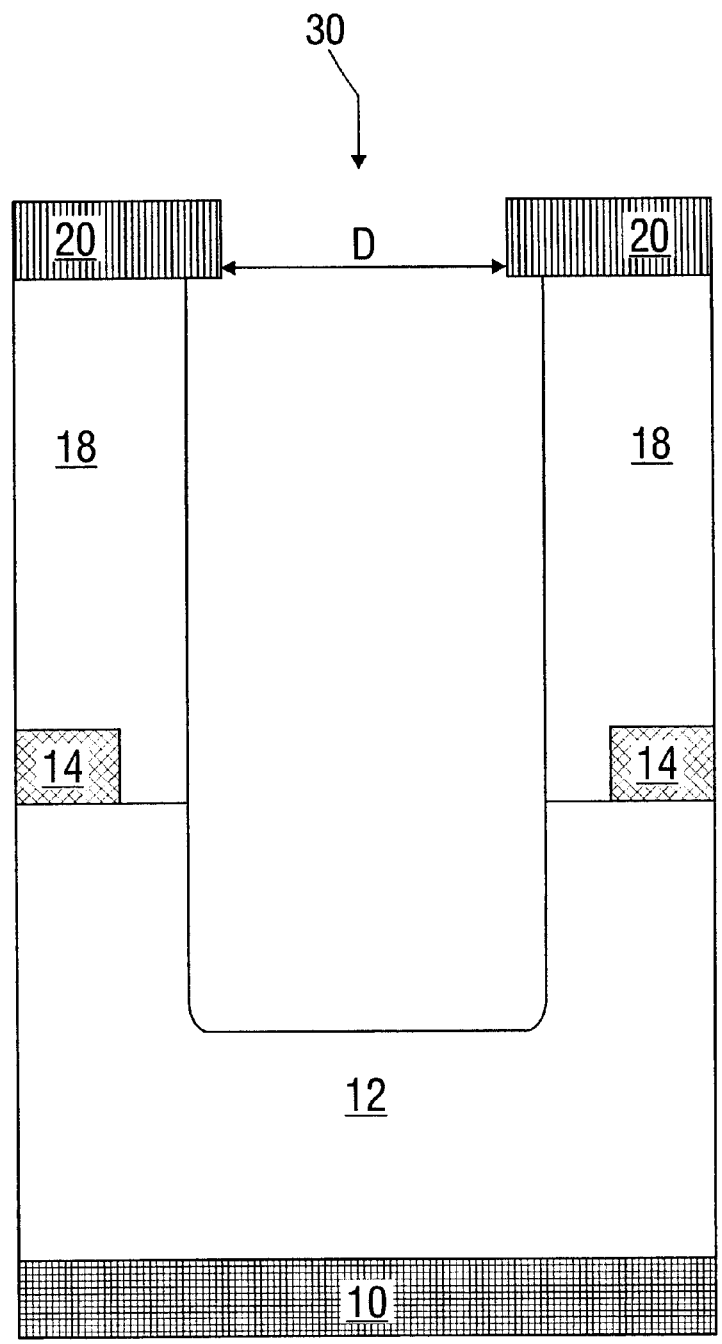
FIG. 6 shows the cross-sectional view of FIG. 4 after an isotropic dielectric etch.

The device is next subject to a cleaning step to remove any etch residue from areas 14a, 14b, 14c and 14d and from the edges of the first conductive layer 14 that are exposed within the via 30. Such a cleaning step is preferably an etch which preferentially attacks oxides such as a wet diluted hydrofluoric acid etch. Because this etch is isotropic, it will etch the vertical and horizontal surfaces of any oxide that is exposed, as best seen in FIGS. 5 and 6, which show the continuation of the process after FIGS. 3 and 4, respectively. Therefore, and most importantly, those portions of the first dielectric which are located beneath areas 14a, 14b, 14c and 14d will be undercut slightly as represented by element 35, as seen in FIG. 5. The extent of this undercut 35 has been exaggerated to more clearly highlight the advantages of this embodiment of the invention.

Figure 7:
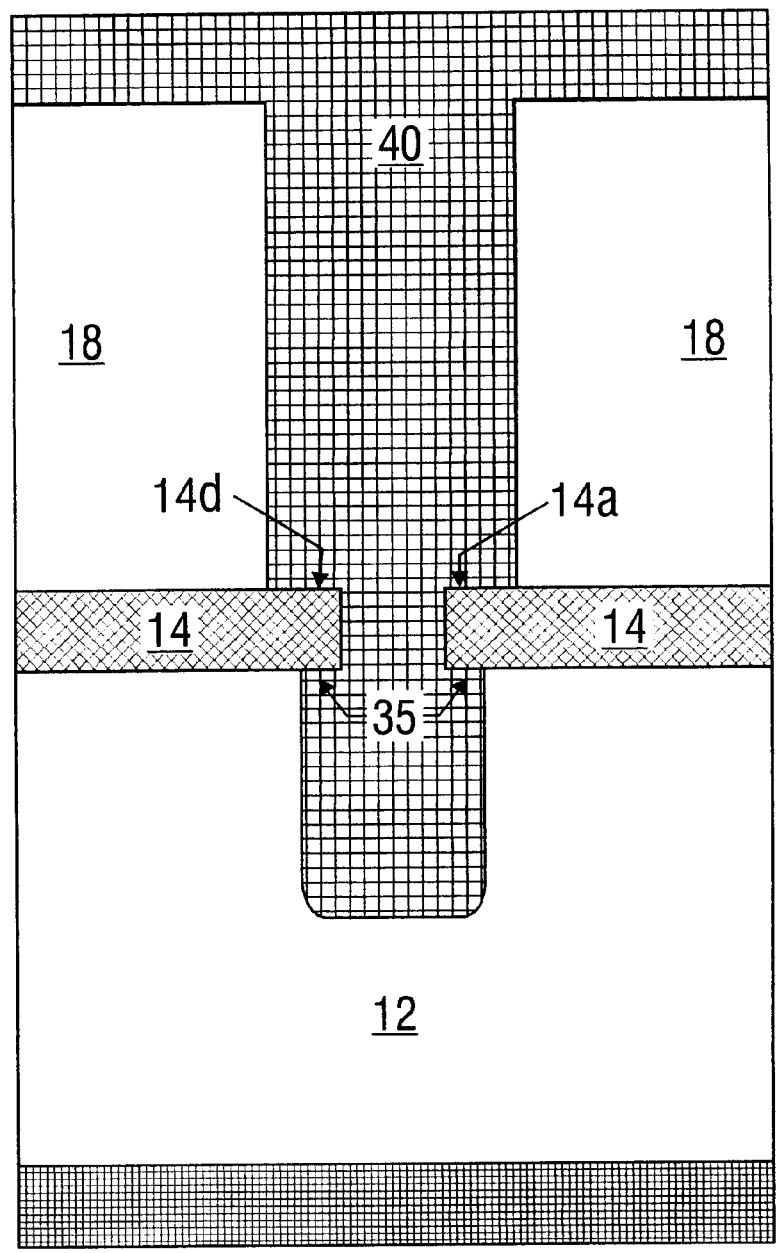
FIG. 7 shows the cross-sectional view of FIG. 5 after deposition of a conductive material.
Figure 8:
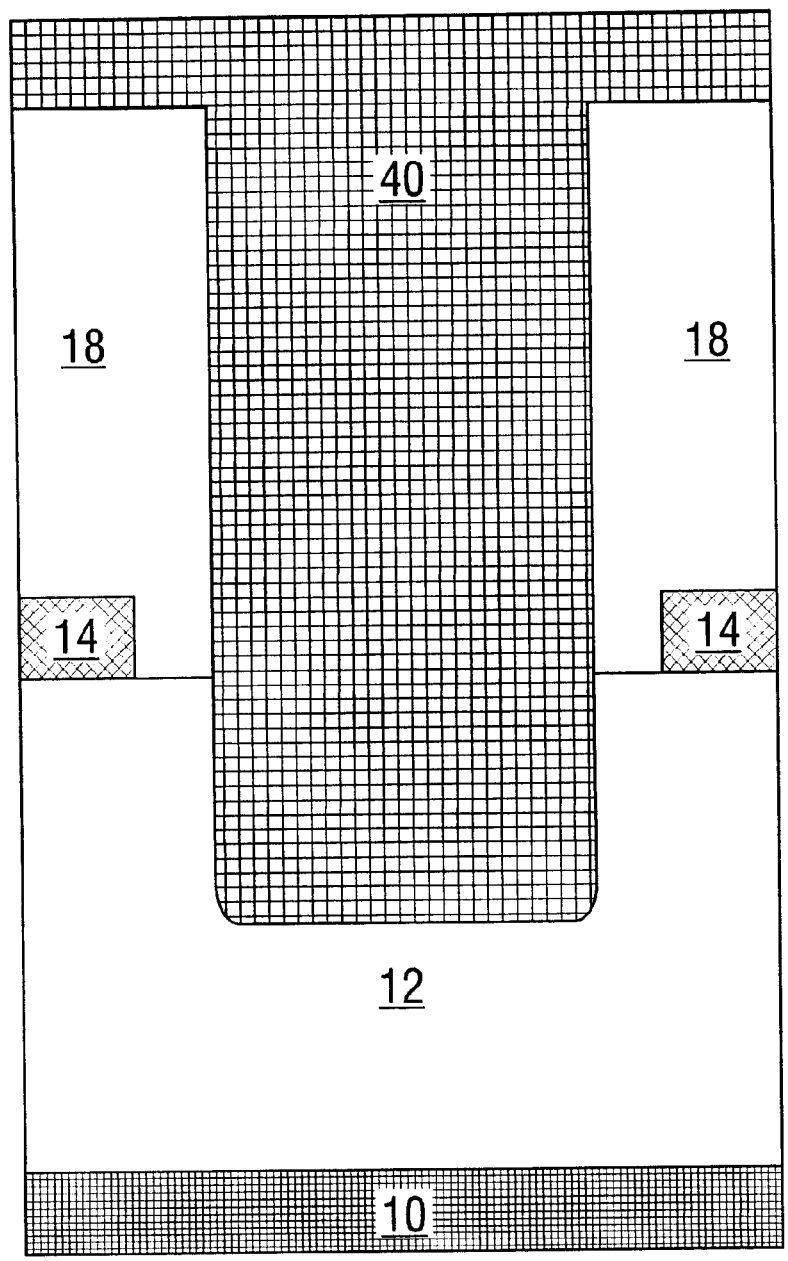
FIG. 8 shows the cross-sectional view of FIG. 6 after deposition of a conductive material.
Figure 9:
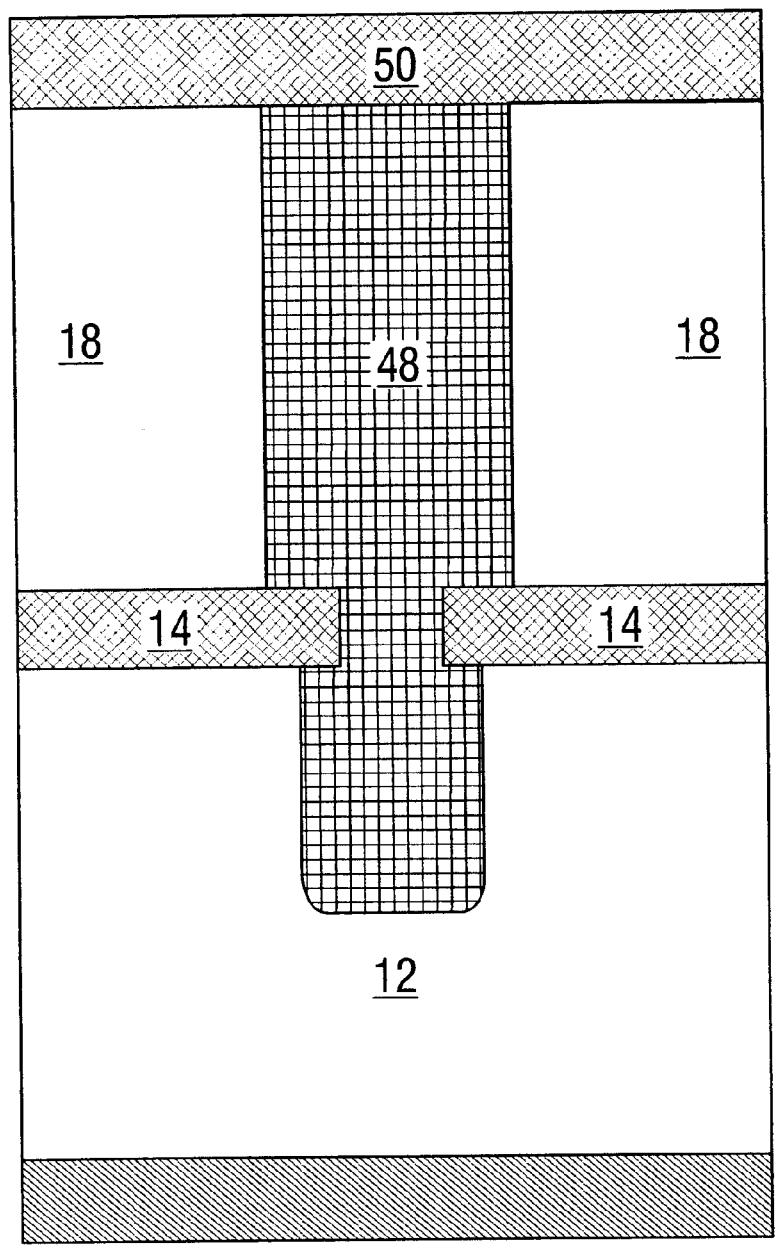
FIG. 9 shows the cross-sectional view of FIG. 7 after the formation of a plug from the conductive material and deposition of a second conductive layer.
Figure 10:
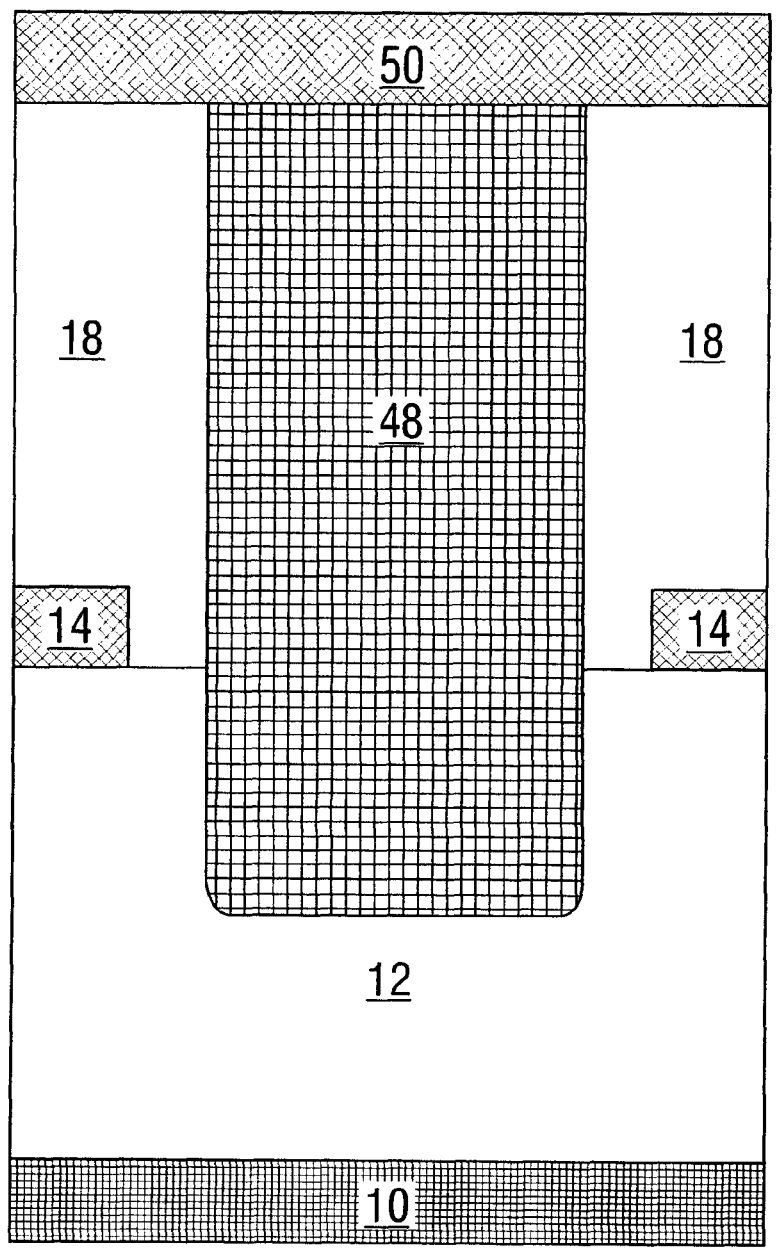
FIG. 10 shows the cross-sectional view of FIG. 8 after the formation of a plug from the conductive material and deposition of a second conductive layer.
Figure 11:
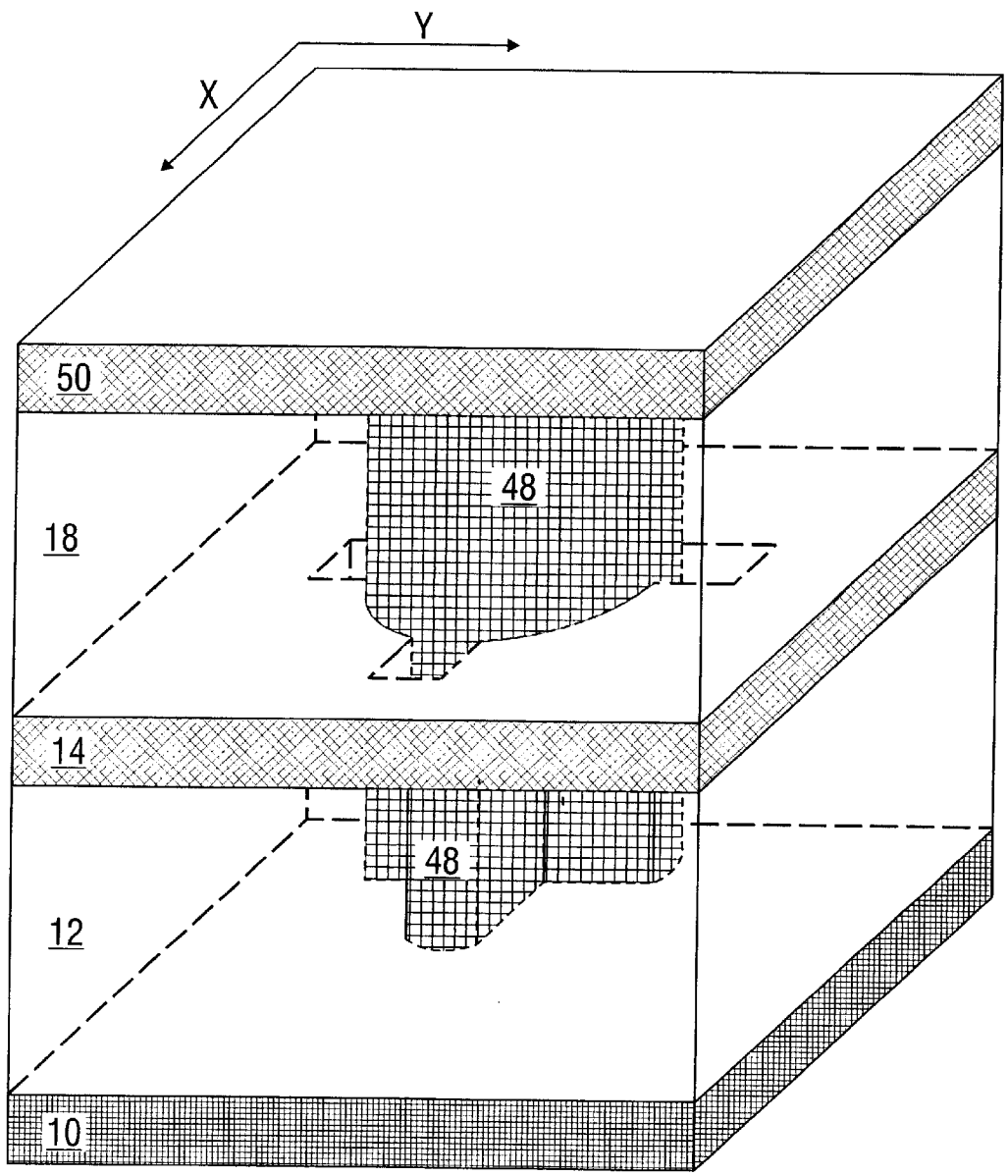
FIG. 11 shows a three-dimensional view of the completed improved contact structure.

Next, and referring to FIGS. 7 and 8, which show the continuation of the process after FIGS. 5 and 6, respectively, a conductive material 40 is deposited on the surface of the structure and into via 30 after photoresist 20 is removed. Such a material is preferably tungsten, but could be polysilicon, aluminum, titanium or any other conductive material suitable for making a contact. The conductive material 40 will to some extent fill the undercut 35 under areas 14a, 14b, 14c and 14d and will also come into contact with the edges of the first conductive layer 14 (where it is exposed within via 30) and areas 14a, 14b, 14c and 14d. FIGS. 7 and 8 show that the conductive material 40 has completely filled the undercut 35, but one skilled in the art will realize that, due to the limitations of deposition technology, perfect filling will not be possible, particularly if the extent of undercutting is quite pronounced. Thereafter, the excess conductive material 40 on the surface of the second dielectric layer 18 is removed, for example, by CMP, thus leaving behind a plug 48 inside of via 30, as shown in FIGS. 9 and 10. Plug 48 is in turn connected to a second conductive layer 50, which, for example, may be connected to the generator that provides the cell plate reference voltage. (Alternatively, the remaining conductive material 40 on the surface of the second dielectric layer 18 could be patterned and connected to the cell plate reference voltage generator, thus saving a few processing steps). A completed three-dimensional of the contact formed is shown in FIG. 11.

The end result is a highly reliable contact between the first and second conductive layers 14 and 50. The cross 16 ensures a mechanical/electrical contact between the plug 48 and the first conductive layer 14 that is much improved over standard contacts in which these two structures meet at a strictly planar interface. That the conductive material 40 fills the undercut 35 further enhances the stability of the contact by preventing the plug 48 from pulling away from the structure, for example during CMP or wet clean.

Moreover, the cross 16 compensates for a certain extent of misalignment of the overlying via 30. As best shown in FIG. 2, if the via 30 is etched too far in the X direction, areas 14a and 14d will ensure sufficient contact. If the via 30 is etched too far in the Y direction, areas 14a and 14b will ensure sufficient contact.

One skilled in the art having the advantage of this disclosure will recognize that other geometries etched into the first conductive layer 14 can take the place of cross 16 while still achieving the benefits disclosed herein. For example, the cross 16 could instead be a slot, or a circle similar to via 30 but smaller in diameter. A preferable geometry will be one which contains a dimension which is smaller than the diameter D of the via 30. If a geometry has an additional dimension that is greater than diameter D, the via will enjoy improved performance from misalignment.

The advantages provided by this embodiment may be built upon to provide a highly reliable structure for connecting several conductive layers. For example, if the anisotropic dielectric etch is continued in FIGS. 2–4, the surface of the substrate 10 would eventually be reached. If the remainder of the process steps as disclosed above are followed, the plug 48 would contact the surface of the substrate 10. (Alternatively, the plug could come-into contact with another conductive layer between the first conductive layer 14 and the substrate 10, not shown in the Figures). In this way, the plug can be made to contact three conductive layers— the substrate 10 (referring loosely to the substrate as a "conductive layer," even though its conductivity might be less than a metal), the first conductive layer 14 and second conductive layer 50. Moreover, for the reasons outlined above, this contact will be of very high quality, particularly if some undercutting of the dielectrics is performed.

Figure 12:
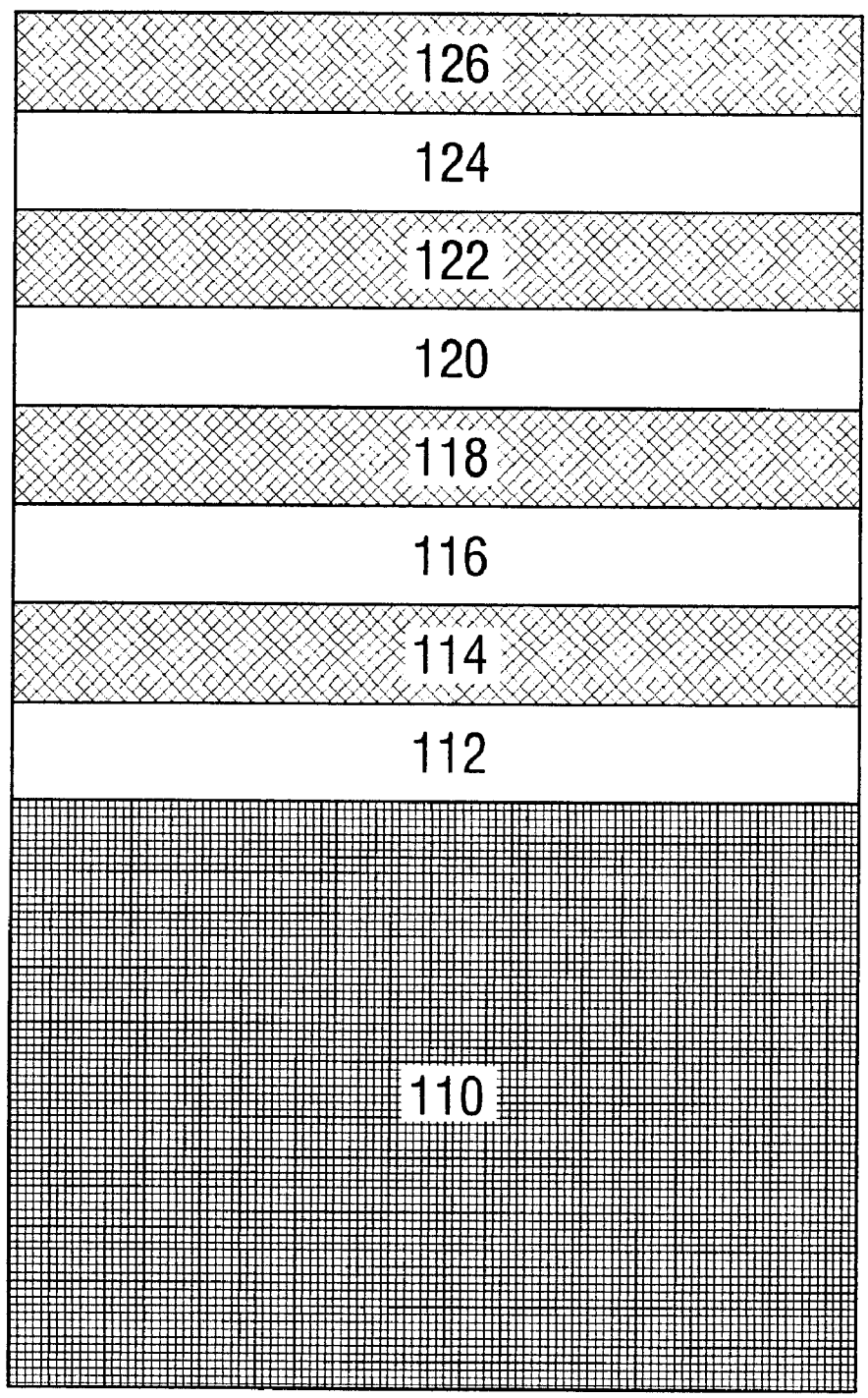
FIG. 12 shows a simplified representation of four conductive layers as separated by dielectric layers.

An adaptation of this technique may also be used to form a structure capable of connecting four conductive layers. A general description of this embodiment of the invention is shown in FIG. 12. FIG. 12 shows a substrate 110, a first dielectric layer 112, a first conducting layer 114, a second dielectric layer 116, a second conductive layer 118, a third dielectric layer 120, a third conductive layer 122, a fourth dielectric layer 124, and a fourth conductive layer 126. The dielectric layers 112, 116, 120 and 124 are typically oxides, but other suitable dielectrics such as nitrides can also be used. The conductive layers 114, 118, 122 and 126 are typically aluminum, titanium, tungsten, doped polysilicon, or crystalline silicon, but may be any conductive layer suitable for use in semiconductor processing. The goal of this embodiment is to create a simple and reliable short circuit that connects the first, second, third and fourth conductive layers 114, 118, 122 and 126.

Figure 13:
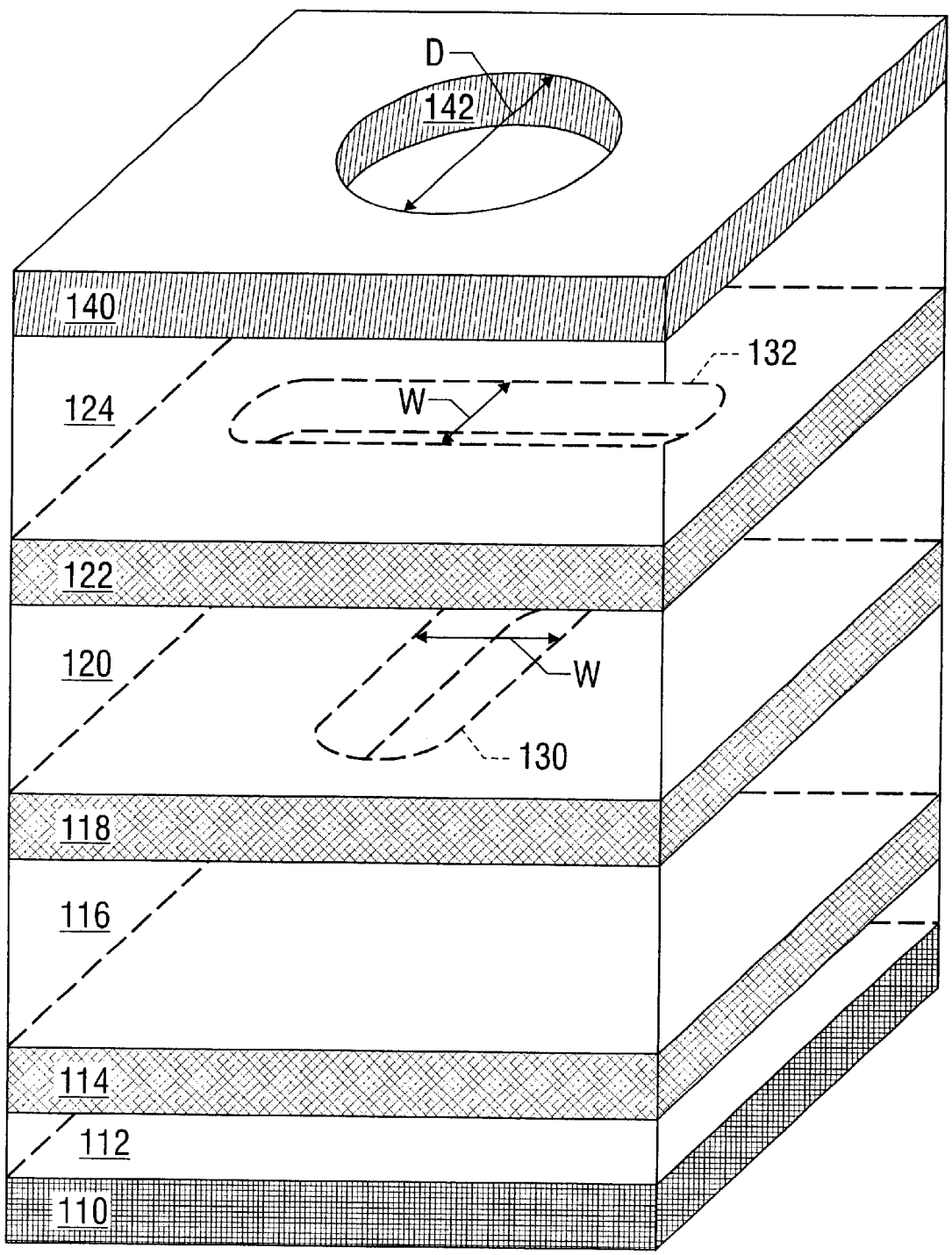
FIG. 13 shows a three-dimensional view of, inter alia, a first, second, and third conductive layer, wherein the second and third conductive layers have slots etched therein.

This embodiment of the invention is shown at an initial stage in FIG. 13. The second and third conductive layers 118 and 122 are created with slots 130 and 132 etched respectively therein. As one skilled in the art will recognize, the slots 130 and 132 can be etched at the same time that other useful structures, such as wires, are etched in the second and third conductive layers 118 and 122. In this embodiment, slots 130 and 132 are essentially oval-shaped and orthogonal with respect to each other. The dielectric layers 112, 116, 120, and 124 would usually be appropriately smoothed before deposition of a conductive layer thereupon, for example by CMP.

At this point in the process, a photoresist 140 is applied on the surface of the fourth dielectric layer 124. The photoresist 140 has been exposed and developed using industry standard techniques to leave an opening 142 therein. To practice this embodiment of the invention, it is preferable that the diameter D of opening 142 be greater than the width W of slots 130 and 132, for reasons that will become clear shortly.

Figure 14:
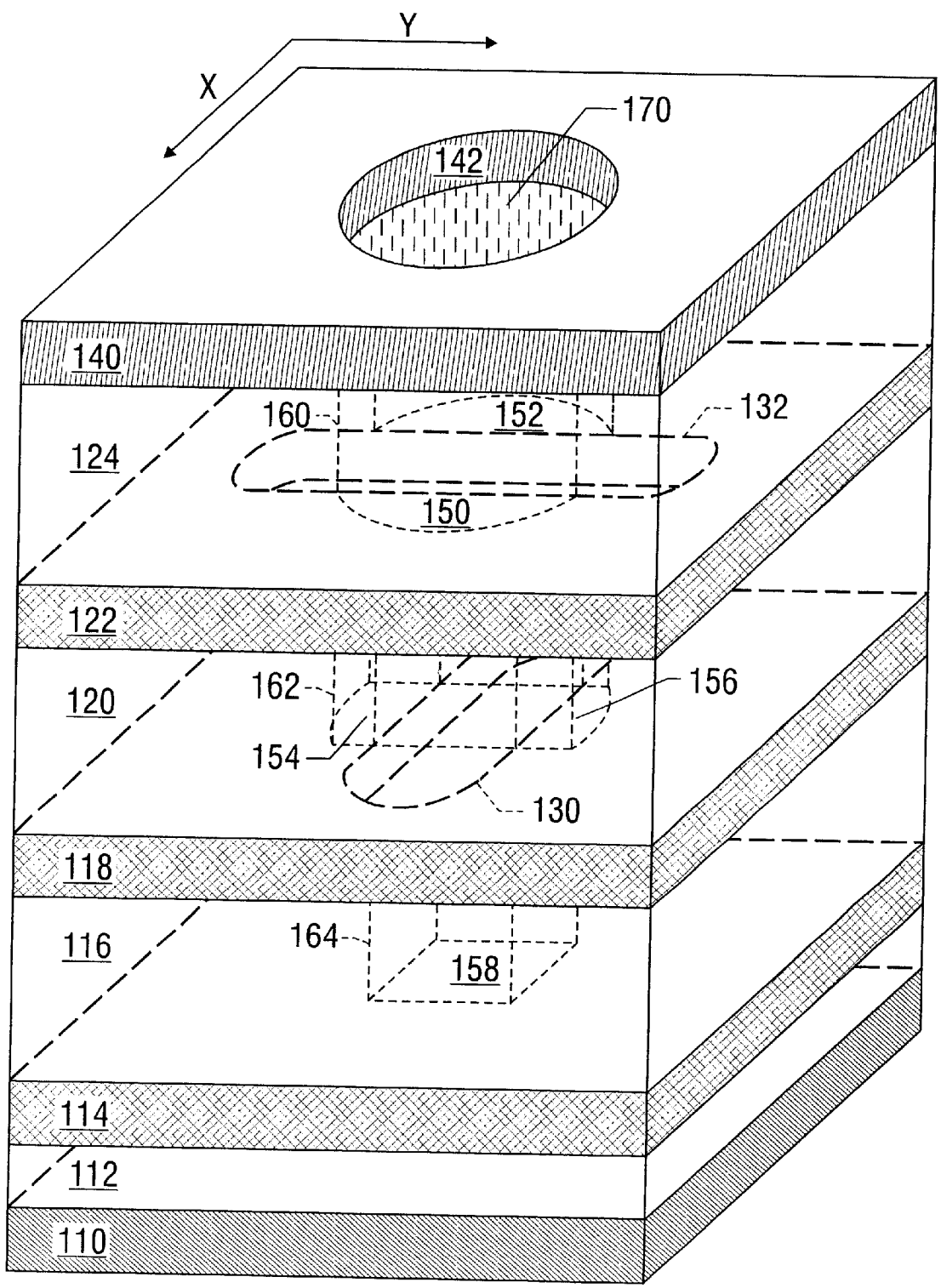
FIG. 14 shows a three-dimensional view of the process after deposition of a fourth dielectric layer and etching of a via within the device.

The device is next subject to an anisotropic dielectric etch, and one of ordinary skill will recognize that several suitable dielectric etches exist in the art of semiconductor processing. This etch results in the formation of a cylindrical via 160 in the fourth dielectric layer 124, as shown in FIG. 14. Because the opening 142 is wider than the width of slot 132, when the dielectric etch hits the slot 132, etching of the third dielectric layer 120 will be blocked by areas 150 and 152 of the third conductive layer 122. As one of skill will recognize, areas 150 and 152 will be unaffected by the dielectric etch because of its high selectivity thereto, and thus acts as a mask with respect to further etching of the structure. Thus, as the etch proceeds downward through the third conductive layer 120, the geometry of the via 162 that is formed in the third dielectric layer 120, when viewed from the top of the device, constitutes the intersection of the circular geometry of the opening 142 and of the oval shape of slot 132, as shown in FIG. 14. When the oxide etch hits the slot 130, the etch will be blocked by areas 154 and 156 of the second conductive layer 118. Like areas 150 and 152, areas 154 and 156 further narrow the geometry of the via as it progresses down through the second dielectric layer 116. When viewed from the top of the device, the geometry of the via 164 that is formed in the second dielectric layer 116 constitutes the intersection of the geometry of via 162 and the oval shape of slot 130, which, in this embodiment, constitutes a square. Eventually, as the dielectric etch continues, the first conductive layer 114 is reached at area 158 and the dielectric etch is terminated. In the end, a large, telescoping via 170 is formed of via portions 160, 162, and 164. One of skill will realize that the dielectric etch used to form via 170 need not be one continual etch, but instead may comprise a series of smaller etching steps, specifically tailored to the appropriate etching of the second, third and fourth dielectric layers 116, 120, and 124.

The device is next preferably subject to a cleaning step to remove any etch residue from areas 150, 152, 154, 156, and 158 and from the edges of the second and third conductive layers 118 and 122 that are exposed within the via 170. Such a cleaning step is preferably an isotropic wet diluted hydrofluoric acid etch. As noted in conjunction with the text accompanying FIGS. 5 and 6, this isotropic etch will broaden via 170 so as to increase the area of areas 150, 152, 154, 156, and 158 slightly, and will create undercuts under the conductive layers 118 and 122 which are similar to undercut 35. This undercut, however, is not shown in FIG. 14 for simplicity.

Figure 15:
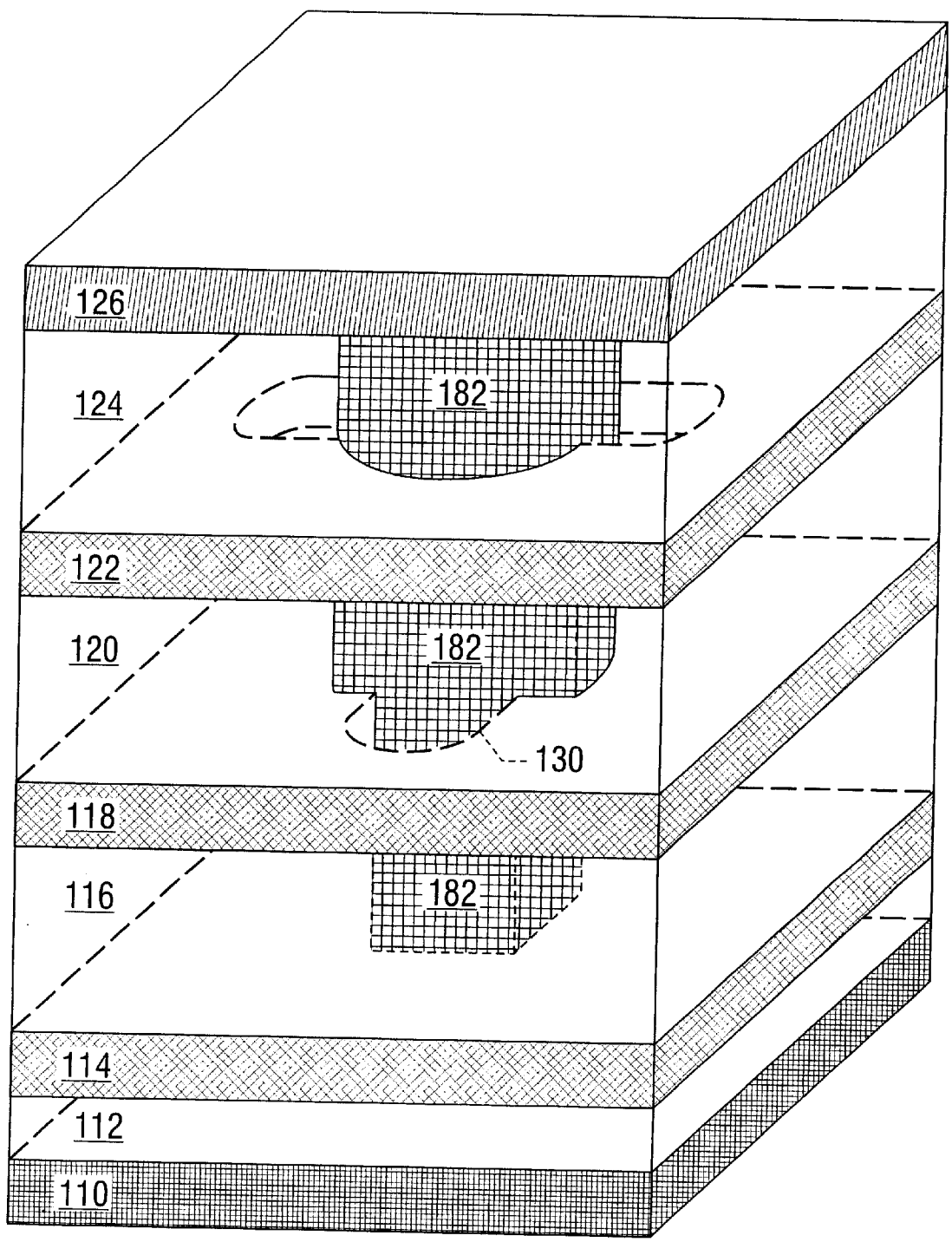
FIG. 15 shows a three-dimensional view of the completed contact structure.

Next, a conductive material 180 is deposited on the surface of the wafer such that it fills via 170 to form plug 182, as shown in FIG. 15. Although many suitable materials exist for conductive material 180, tungsten is preferred because of its ability to fill high aspect ratio structures such as via 170 without substantial voiding. Due to the unique way in which via 170 was formed, plug 182 makes excellent structural contact with the first, second, and third conductive layers 114, 118 and 122. Not only does the plug 182 contact those layers at areas 150, 152, 154, 156, and 158, but it also contacts the sides of those layers, and those portions of those layers beneath areas 150, 152, 154 and 156 in the undercut region. At this point in the process, the fourth conductive layer 126 can be deposited on the fourth dielectric layer 124 and brought into contact with plug 182, as shown in FIG. 15. This arrangement assumes that the remainder of conductive material 180 has been removed from the surface of the fourth dielectric layer 124, for example, by CMP. Alternatively, the fourth conductive layer 126 can be formed from the remaining conductive material.

The foregoing technique thus results in a plug 182 that forms a good mechanical/electrical contact with the conductive layers with which it is in contact. Similar to the plug 48, plug 182 makes excellent contact with the conductive layers because it contacts them on multiple sides. Furthermore, because of the filling of the undercut regions, the plug 182 will be less susceptible to being dislodged. The plug 182 is also desirable because it is not easily susceptible to misalignment. Even if opening 142 and slots 130 and 132 are slightly misaligned with respect to one another, the plug 182 which is formed will still enjoy good contact to the layers with which it is in contact. For example, and referring to FIG. 14, if the opening 142 is shifted in direction X, good contact with third conductive layer 122 is ensured by the increase in the area of area 150. Contact with the second conductive layer 118 is largely unaffected. If opening 142 is shifted in direction Y, good contact with second conductive layer 118 is ensured by the resulting increase in the area of area 156. Contact with the third conductive layer 122 is largely unaffected.

Of course, many geometries will facilitate the formation of a plug 182 of similar properties. For example, instead of using slots 130 and 132, round openings can be used. Good mechanical/electrical contact and good tolerance to misalignment are achieved if opening 142 is of a larger diameter than the opening in the third conductive layer 122, and if the opening in the third conductive layer 122 is of a larger diameter than the opening in the second conductive layer 118. Alternatively, openings in the second and third conductive layers could be slots similar in shape to slots 130 and 132, but arranged 120 degrees with respect to each other. Many other suitable geometries exist, as one of skill will instantly realize.

Moreover, the technique can be modified to connect only certain of the conductive layers while by-passing the connection of other intermediate conductive layers. Thus, if the slot 130 or other opening in second conductive layer 118 is made large enough, the via 170 can be made to directly pass therethrough without coming into contact with the second conductive layer 118. In such an embodiment, the end result is a plug with connects the first, third and fourth conductive layers 114, 122 and 126, but not the second conductive layer 118.

From the foregoing detailed description of specific embodiments of the invention, it should be apparent that an improved method of making contacts in a microelectronic device has been disclosed. Although specific embodiments of the invention have been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

What is claimed is:

1. A contact structure for connecting a first conductive layer and a second conductive layer in a microelectronic device, comprising:
    a first dielectric layer formed on a substrate;
    a first conductive layer formed on the first dielectric layer, the first conductive layer having a pattern etched therein, the pattern defining an edge in the first conductive layer;
    a second dielectric layer deposited on the top surface of the first conductive layer;
    a hole located in the second dielectric layer and at least part of the first dielectric layer, wherein the hole exposes at least a portion of the edge in the first conductive layer and wherein the hole defines an undercut region in the first dielectric layer below the first conductive layer;
    a conductive material located in the hole, wherein the conductive material substantially fills the undercut region, and wherein the conductive material is in contact with at least a portion of the exposed edge in the first conductive layer; and
    a second conductive layer in contact with the conductive material, whereby the first and second conductive layers are brought into contact through the conductive material.

2. The contact structure of claim 1, wherein the conductive material comprises a plug.

3. The contact structure of claim 1 wherein the pattern is a cross.

4. The contact structure of claim 1 wherein the conductive material and the second conductive layer are formed simultaneously.

5. A contact structure for connecting a first conductive layer, a second conductive layer, and a third conductive layer in a microelectronic device, comprising:
    a first conductive layer formed on a substrate, the first conductive layer having a top surface;
    a first dielectric layer deposited on the top surface of the first conductive layer;
    a second conductive layer formed on the first dielectric layer, the second conductive layer having a pattern etched therein, the pattern defining an edge in the second conductive layer;

a second dielectric layer formed on the second conductive layer;

a hole located in the second and first dielectric layers, wherein the hole exposes at least:

a portion of the edge in the second conductive layer, and a portion of the top surface of the first conductive layer;

a conductive material located in the hole, wherein the conductive material is in contact with at least:

a portion of the exposed edge in the second conductive layer, and a portion of the exposed top surface of the first conductive layer; and a third conductive layer in contact with the conductive material, whereby the first, second, and third conductive layers are brought into contact through the conductive material.

6. The contact structure of claim 5, wherein the hole further comprises an undercut region in the first dielectric layer below the second conductive layer proximate to at least a portion of the edge in the second conductive layer, and wherein the conductive material substantially fills the undercut region.

7. The contact structure of claim 5, wherein the conductive material comprises a plug.

8. The contact structure of claim 5 wherein the pattern is a cross.

9. The contact structure e of claim 5 wherein the conductive material and the third conductive layer a re formed simultaneously.

10. A contact structure for connecting a first conductive layer, a second conductive layer, a third conductive layer, and a fourth conductive layer in a microelectronic device, comprising:

a first conductive layer formed on a substrate, the first conductive layer having a top surface;

a first dielectric layer deposited on the top surface of the first conductive layer;

a second conductive layer formed on the first dielectric layer, the second conductive layer having a first pattern etched therein, the first pattern defining an edge in the second conductive layer;

a second dielectric layer formed on the top surface of the second conductive layer;

a third conductive layer formed on the second dielectric layer, the third conductive layer having a second pattern etched therein, the second pattern defining an edge in the third conductive layer;

a third dielectric layer formed on the top surface of the third conductive layer;

a hole located in the third, second, and first dielectric layers, wherein the hole exposes at least:

a portion of the edges in the third and second conductive layers, and a portion of the top surface of the first conductive layer;

a conductive material located in the hole, wherein the conductive material substantially fills the hole, and wherein the conductive material is in contact with at least:

a portion of the exposed edges in the third and second conductive layers, and a portion of the exposed top surface of the first conductive layer; and a fourth conductive layer in contact with the conductive material, whereby the first, second, third, and fourth conductive layers are brought into contact through the conductive material.

11. The contact structure of claim 10, wherein the hole further comprises undercut regions in the first and second dielectric layers below the second and third conductive layers proximate to at least a portion of the edges in the second and third conductive layers, and wherein the conductive material substantially fills the undercut regions.

12. The contact structure of claim 10, wherein the conductive material comprises a plug.

13. The contact structure of claim 10 wherein the first and second patterns are orthogonal with respect to each other.

14. The contact structure of claim 10 wherein the conductive material and the fourth conductive layer are formed simultaneously.

15. A contact structure for connecting a first conductive layer and a second conductive layer in a microelectronic device, comprising:

a layered stack comprising in sequence a first dielectric layer, a first conductive layer, a second dielectric layer, and a second conductive layer; and a hole located in the first and second conductive layers, wherein the hole further comprises an undercut appearing beneath a portion of the first conductive layer, and wherein the hole is filled with a unitary conductive material.

16. A contact structure for connecting a plurality of conductive layers in a microelectronic device, comprising:

a layered stack comprising in sequence a first conductive layer, a first dielectric layer, a second conductive layer, a second dielectric layer, and a third conductive layer; and a hole located in the first and second dielectric layers, wherein the hole is filled with a unitary conductive material which connects the first, second, and third conductive layers.

17. The contact structure of claim 16, wherein the layered stack further comprises a third dielectric layer and a fourth conductive layer, and wherein the hole is further located in the third dielectric layer, and wherein the unitary conductive materials connects to the fourth conductive layer.

* * * * *